United States Patent [19]
Hurwitt et al.

[11] Patent Number: 5,925,226
[45] Date of Patent: *Jul. 20, 1999

[54] APPARATUS AND METHOD FOR CLAMPING A SUBSTRATE

[75] Inventors: Steven Hurwitt, Park Ridge; Vaclav Jelinek, River Edge, both of N.J.

[73] Assignee: Tokyo Electron Limited, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/820,818

[22] Filed: Mar. 19, 1997

Related U.S. Application Data

[63] Continuation of application No. 08/306,340, Sep. 15, 1994, abandoned.

[51] Int. Cl.[6] .................................................. C23C 14/50
[52] U.S. Cl. ................... 204/298.15; 118/728; 118/729; 156/345; 269/245 R
[58] Field of Search ...................... 204/298.15; 118/728, 118/729, 500, 503; 156/345; 269/245 R

[56] References Cited

U.S. PATENT DOCUMENTS

| | | | |
|---|---|---|---|
| 4,473,455 | 9/1984 | Dean et al. | 118/500 |
| 4,671,204 | 6/1987 | Ballou | 118/503 |
| 4,909,695 | 3/1990 | Hurwitt et al. | 414/217 |
| 4,931,135 | 6/1990 | Horiuchi et al. | 156/345 |
| 4,932,358 | 6/1990 | Studley et al. | 118/500 |
| 4,978,412 | 12/1990 | Aoki et al. | 205/298.15 |
| 5,078,851 | 1/1992 | Nishihata et al. | 156/345 |
| 5,228,501 | 7/1993 | Tepman et al. | 118/728 |
| 5,266,527 | 11/1993 | Robbins | 156/643 |
| 5,316,278 | 5/1994 | Sherstinsky et al. | 269/254 R |

FOREIGN PATENT DOCUMENTS

| | | |
|---|---|---|
| 0342 688 A2 | 5/1989 | European Pat. Off. . |
| 0 342 688 | 11/1989 | European Pat. Off. . |

*Primary Examiner*—Nam Nguyen
*Assistant Examiner*—Rodney G. McDonald
*Attorney, Agent, or Firm*—Wood, Herron & Evans, LLP

[57] ABSTRACT

An apparatus is disclosed for clamping a substrate or wafer with a predetermined force during a sputtering process for maintaining a minimal gap between the wafer and a backplane in order to provide a uniform temperature distribution on the wafer. The apparatus includes a first suspension system which includes a diaphragm having a plurality of spring sections positioned in contact with an outer peripheral area of an upper surface of the wafer. The spring sections are positioned immediately adjacent to each other to provide substantially continuous and uniform loading of the outer periphery in order to eliminate edge gaps. The apparatus further includes a second suspension system which includes a mounting ring having a plurality of springs each of which are secured to a fixed element. The first and second suspension systems are configured such that approximately 80 to 90% of the total spring deflection is provided by the second suspension system whereas the remaining 10 to 20% of the total spring deflection is provided by the first suspension system.

9 Claims, 2 Drawing Sheets

APPARATUS AND METHOD FOR CLAMPING A SUBSTRATE

This is a continuation of application Ser. No. 08/306,340 filed on Sep. 15, 1994, abandoned, which is hereby incorporated by reference.

The disclosure of U.S. Pat. No. 4,909,695 is hereby incorporated herein by reference.

BACKGROUND

1. Field of the Invention

The present invention relates to the sputtering of thin films onto a substrate and more particularly, to an apparatus and a method for clamping the substrate so as to substantially eliminate excessive gap sizes between the substrate and the backplane which degrade thermal transfer to the substrate.

2. Background of the Invention

An integrated circuit (IC) is manufactured by a process which utilizes planar technology. Generally, this process includes subjecting a substrate, such as a silicon or a gallium arsenide wafer, to a sputtering process in which a thin layer or film of metal is deposited on the substrate.

It is essential that the wafer be maintained at a predetermined temperature which is distributed uniformly on the wafer during the sputtering process. In order to achieve this, the wafer is placed on a thermal backplane which serves to maintain the wafer at the predetermined temperature through conduction. However, due to surface imperfections and other irregularities, substantial areas of the wafer and the backplane are not in actual physical contact with each other, thus hindering uniform temperature distribution on the wafer. A thermally conductive gas is then provided between the backplane and the wafer in order to transfer heat between areas of the backplane and wafer which are not in contact with each other to thus ensure uniform temperature distribution on the wafer.

The gas creates pressure against the wafer which moves the wafer away from the backplane, thus creating a gap between the wafer and the backplane. It is desirable that the size of gap be minimized in order to ensure uniform temperature distribution. In particular, it has been found that a gap size not exceeding approximately 0.002 inches is preferable. Gap sizes in excess of 0.002 inches undesirably result in a degradation of thermal transfer and in uniformity of temperature distribution on the wafer. Further, such gap sizes result in excess gas leakage.

During the sputtering process, the wafer is held by a clamping mechanism which provides a clamping force for restraining the wafer and maintaining a minimal gap size between the wafer and backplane. Referring to FIG. 1, a cross sectional view of one type of clamping mechanism 10 is shown. The clamping mechanism 10 is used for clamping a wafer 12 which is fabricated from a resilient material and which includes an upper 14 and lower 16 surface. In particular, the clamping mechanism 10 includes a clamp ring 18 having a contact surface 20 which contacts edges of the upper surface 14 of the wafer 12 and serves to clamp the wafer 12.

The clamping mechanism 10 is used in conjunction with a backplane 22 having a convex shaped backplane surface 24. In use, the backplane surface 24 is displaced against the lower surface 16, thus urging the wafer 12 against the contact surface 20. This restrains the wafer 12 and causes the wafer 12 to conform to the convex shape of backplane surface 24. The backplane 22 includes a central passageway 26 which extends through the backplane 22 toward the backplane surface 24. Conducting gas is fed through the central passageway 26 (shown by arrow) and is discharged against the lower surface 16 of the wafer 12 so as to create pressure against the lower surface 16 of the wafer 12, thus urging the wafer 12 against the contact surface 20 of the clamp ring 18. Essentially, the clamping force for restraining the wafer 12 and maintaining a gap size 28 not exceeding 0.002 inches between the backplane surface 24 and the lower surface 16 substantially depends upon the mechanical properties and dimensions of the wafer 12, curvature of backplane surface 24 and the pressure of the conducting gas against the wafer 12. Typically, for an eight-inch diameter silicon wafer, a total clamping force in the range of approximately 5 to 20 pounds is desirable.

The clamping mechanism 10 further includes springs 30 each of which are secured between a fixed member 32 and the clamp ring 18. The springs 30 are affixed such that they become extended and thus biased to urge the clamp ring 18 and ultimately the wafer 12 against the backplane surface 24 and withstand the pressure of the conducting gas to thus restrain the clamp ring 18 and wafer 12. In addition, the springs 30 are sized so as to provide the desired clamping force suitable for urging the wafer 12 against the backplane surface 24 and such that the gap size 28 does not exceed 0.002 inches.

In order to minimize the gap size 28, the contact surface 20 of the clamp ring 18 and the backplane surface 24 are precisely machined. Further, it is essential that the machined surfaces and the overall shape of the backplane 22 and the clamp ring 18 remain substantially stable and distortion free during the sputtering process. As such, both the backplane 22 and clamp ring 18 are fabricated so that they are relatively massive in size in order to reduce distortions due to temperature and other factors. However, the wafer 12, backplane 22 and clamping mechanism 10 are subjected to very severe environmental conditions during the sputtering process which includes frequent temperature cycling over very large temperature ranges such as, for example, between room temperature and approximately 600° C. This temperature cycling is sufficient to frequently cause distortion of the clamp ring 18 and backplane 22 notwithstanding their relatively massive size and results in a loss of precision fit which undesirably increases the gap size 28 to greater than 0.002 inches and causes other undesirable effects. Further, the physical location of the clamp ring 18 results in the deposition of undesirable excess materials on the clamp ring 18 as a result of the sputtering process. This further exacerbates the problem of distortion and associated increase in the gap size 28.

Referring to FIGS. 2a and 2b, an alternate type of clamping mechanism 34 is shown. In particular, FIG. 2a is a cross sectional side view of the alternate clamping mechanism 34 and FIG. 2b is a full top view of the alternate clamping mechanism along line 2b—2b of FIG. 2a. It is noted that the alternate clamping mechanism 34 is also disclosed in U.S. Pat. No. 4,909,695 which issued to Hurwitt, et al. and is assigned to Materials Research Corporation, the assignee herein. In the alternate clamping mechanism 34, an attachment ring 36 is utilized which includes a plurality of spaced apart spring fingers 38. The spring fingers 38 are located around an outer periphery 40 of the wafer 12 and contact an associated section of the upper surface 14 of the wafer 12. Each of the spring fingers 38 are fabricated from a resilient material and serve to independently urge an associated section of the upper surface 14 against the backplane surface 24 and withstand the pressure of the conducting gas. As such, precise flatness of the attachment ring 36 or the backplane 24 is not essential since variances in flatness and other parameters are compensated for by the resiliency of each of the spring fingers 38. Consequently, relatively precise machining techniques are not needed, thus substantially reducing manufacturing costs.

However, it has been found that this type of clamping mechanism forms undesirable edge gaps between spring fingers 38. Referring to FIG. 2c, a side view along line 2c—2c of FIG. 2b is shown of an edge or spring-back gap 42 formed between successive spring fingers 38. As described previously, the wafer 12 is fabricated from a resilient material. Further, the wafer 12 is in contact with spring fingers 38 which are spaced apart from each other. As such, the wafer 12 is not supported along most of the outer periphery 40. Consequently, areas between the wafer 12 and the backplane 22 in between successive spring fingers 38 where the wafer 12 is unsupported tend to deform and form the spring-back gap 42 between each pair of spring fingers 38 along the outer periphery 40. The spring-back gap 42 allows localized leakage of the conducting gas and undesirably degrades heat transfer and uniformity of temperature distribution on the wafer 12. A further disadvantage is that a large number of parts are required to assemble the alternate clamping mechanism 34. In particular, the alternate clamping mechanism 34 includes the attachment ring 36, spring fingers 38 and the associated screws, retainers and alignment devices associated with each spring finger 38. In normal use, the alternate clamping mechanism 34 is frequently disassembled, cleaned and reassembled. As such, the large number of parts results in high maintenance costs.

SUMMARY OF THE INVENTION

A clamping device for providing a clamping force for clamping a substrate which includes a first suspension system having first spring elements for holding the substrate, wherein the first spring elements provide a first spring deflection. The clamping device further includes a second suspension system attached to the first suspension system, wherein the second suspension system includes second spring elements for providing a second spring deflection and wherein the first and second spring deflections cause the first and second suspension systems to generate the clamping force.

BRIEF DESCRIPTION OF THE DRAWINGS

FIG. 2b is a full top view of the alternate prior art clamping mechanism along line 2b—2b of FIG. 2a.

FIG. 3b is a full top view of a diaphragm along line 3a—3a of FIG. 3a.

DETAILED DESCRIPTION OF THE INVENTION

Figure 1:
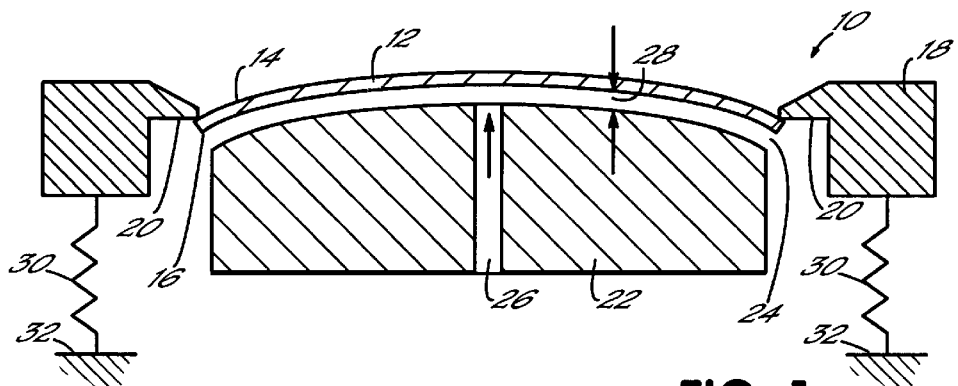
FIG. 1 is a cross sectional side view of a prior art clamping mechanism.
Figure 2A:
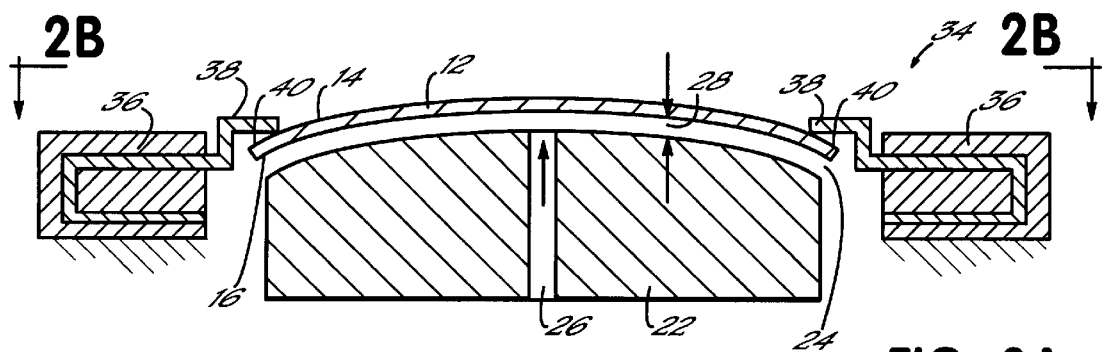
FIG. 2a is a cross sectional side view of an alternate prior art clamping mechanism.
Figure 2B:
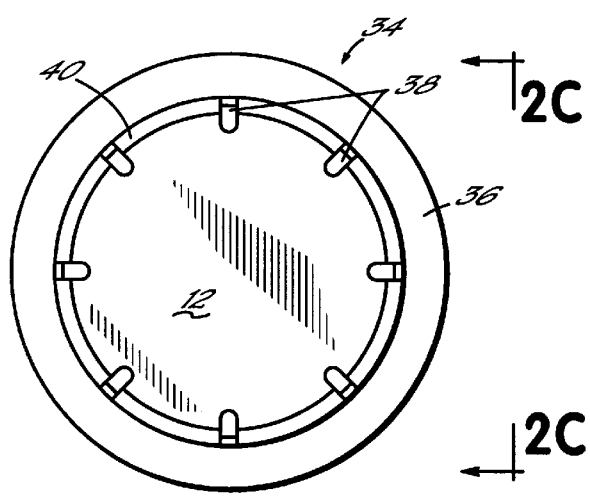
Figure 2C:
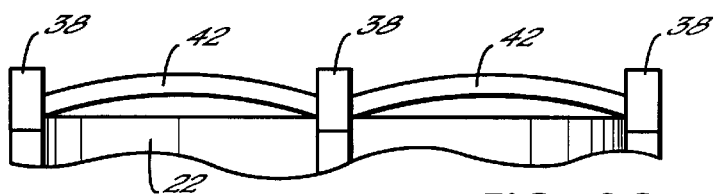
FIG. 2c is a side view of the alternate prior art clamping mechanism along line 2c—2c and depicts a spring-back gap.

The present invention will now be described by referring to FIGS. 3a–4, wherein like elements are designated by like reference numerals. It is noted that elements from FIGS. 1–2c will also be referenced for informational purposes only.

In accordance with the present invention, a clamping mechanism having a dual suspension system will be described. In particular, the clamping mechanism includes a first suspension system which provides a first deflection suitable for compensating for warpage and other mechanical imperfections present in the backplane 24 and the clamping mechanism. In addition, the clamping mechanism includes a second suspension system which provides a second deflection, which, when combined with the first deflection, provides a predetermined clamping force suitable for restraining the wafer 12.

Figure 3A:
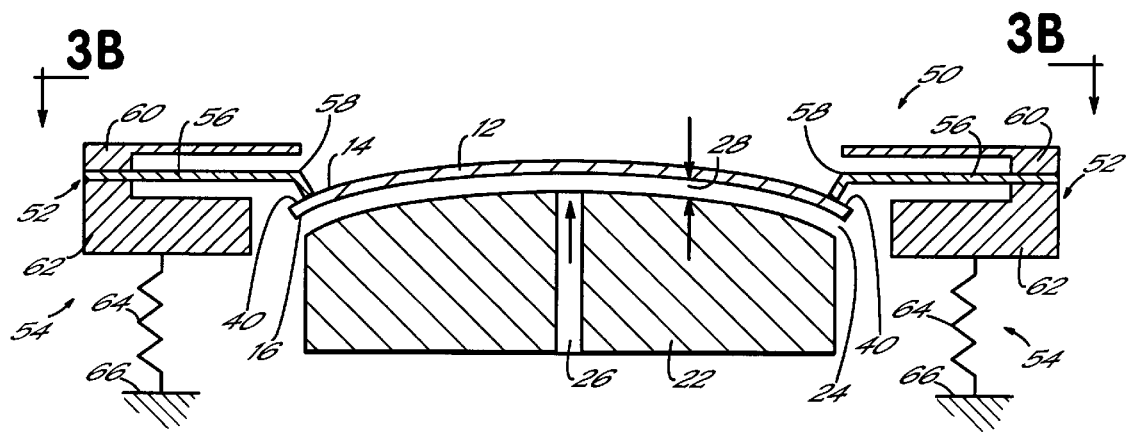
FIG. 3a is a cross sectional side view of a clamping mechanism in accordance with the present invention.

Referring to FIG. 3a, a cross sectional side view of a clamping mechanism 50 in accordance with the present invention is shown. The clamping mechanism 50 includes first 52 and second 54 suspension systems for forming a dual suspension apparatus for minimizing the gap size 28 between the backplane surface 24 and the lower surface 16 of the wafer 12 to a size of 0.002 inches or less and further to maintain a uniform distribution of a predetermined temperature on the wafer 12 during a sputtering process.

The first suspension system 52 includes a diaphragm 56 having a plurality of spring sections 58 each of which are fabricated from a resilient material having a first spring constant. Each of the spring sections 58 are located around the outer periphery 40 of the wafer 12 and are positioned in contact with an associated section of the upper surface 14 of the wafer 12. During the sputtering process, the wafer 12 is urged against the spring sections 58 by motion of the backplane 22 against the lower surface 16 of the wafer 12. This creates a force on each of the spring sections 58 which causes wafer 12 to compliantly conform to backplane surface 24, thus biasing each of the spring sections 58 to independently urge an associated section of the wafer 12 against the backplane surface 24 and withstand the pressure of the conducting gas. In addition, the clamping mechanism 50 includes a shield 60 affixed above the diaphragm 56 to protect the diaphragm 56 from excess deposition which may undesirably affect the first spring constant.

The second suspension system 54 includes a mounting ring 62 which is affixed to the diaphragm 56. A plurality of springs 64 extend from the mounting ring 62, each of which are secured to a fixed element 66. Each of the springs 64 have a second spring constant and are oriented such that they become extended when the mounting ring 62 is displaced by the spring sections 58. This causes the springs 64 to become biased to urge the mounting ring 62, spring sections 58 and ultimately the wafer 12 against the backplane surface 24 and withstand the pressure of the conducting gas to restrain the wafer 12.

Figure 3B:
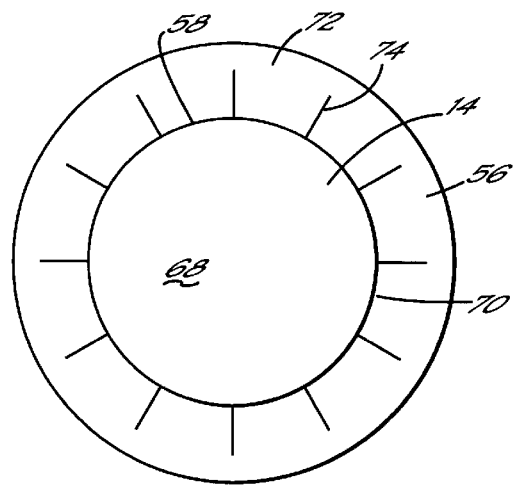

Referring to FIG. 3b, a full top view of the diaphragm along line 3a—3a of FIG. 3a without shield 60 is shown. The diaphragm 56 includes a central aperture 68 positioned within an annular section 72 having an inner edge 70. The central aperture 68 provides access to the upper surface 14 of the wafer 12 to enable sputter coating. The diaphragm 56 further includes a plurality of narrow slits 74 each of which extend radially from the inner edge 70 into a portion of the annular section 72 to form the spring sections 58. Therefore, each of the spring sections 58 are able to move independently from each other. This enables the spring sections 58 to independently compensate for variances in the mounting ring 62 and backplane 22 due to distortion and other factors. Further, this results in a configuration wherein each of the spring sections 58 are separated by a small distance and thus immediately adjacent to one another. As such, the spring sections 58 are in substantially continuous contact with the upper surface 14 on the outer periphery 40 of the wafer 12. By way of example, the slits 74 may be approximately 0.003 to 0.005 inches wide, although it is noted that other sizes may be used which are suitable for providing substantially continuous contact between the spring sections 58 and the upper surface 14.

It is desirable to provide a predetermined clamping force of approximately 5–20 pounds in order to restrain the wafer 12 and to minimize the gap size 28 to a size which is 0.002 inches or less between the wafer 12 and backplane 22. Furthermore, in order to compensate for the mechanical tolerances that are present in the clamping mechanism 50 and other handling mechanisms, it has been determined that a total spring deflection of approximately 0.1 inch is desired to maintain the desired clamping load. In accordance with the present invention, the springs 64 are sized such that approximately 80 to 90% of the total spring deflection is provided by the second suspension system 54.

The remaining deflection, i.e. approximately 10 to 20% of total spring deflection, is provided by the first suspension system 52. It has been determined that this amount is sufficient to compensate for warpage, distortion or lack of precision in the mounting ring 62 and/or backplane 22. Further, the substantially continuous contact of the spring sections 58 on the outer periphery 40 of the wafer 12 enables a substantially continuous and uniform loading of the outer periphery 40. This substantially reduces deformations which cause a spring-back gap 42 (see FIG. 2c) to form and substantially reduces localized leakage of conducting gas. In addition, limiting the required deflection of the spring sections 58 to 10 to 20% of total deflection reduces stresses which are generated in the diaphragm 56, thus increasing the life expectancy of the clamping mechanism 50 at high operating temperatures.

Figure 4:
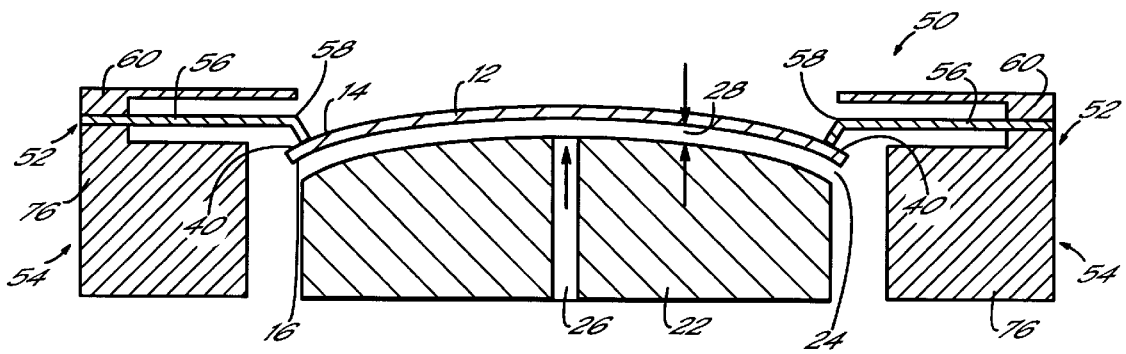
FIG. 4 is a cross sectional side view of an alternate embodiment of a clamping mechanism in accordance with the present invention.

Referring to FIG. 4, a side cross sectional view of an alternate embodiment of the present invention is shown. In this embodiment, the mounting ring 62 and springs 64 are replaced by a fixture block 76 which is attached to the first suspension system 52. The fixture block 76 is sized such that its weight is substantially equivalent to the clamping load provided by the second suspension system 54. In this manner, the desired clamping force is provided by the weight of fixture block 76.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A clamping device for providing a clamping force to secure a substrate for processing, the clamping device comprising:

a movable backplane configured to move to a process position, the backplane including a passsageway for introducing a gas to be discharged from said backplane, wherein said passageway is operable to direct the gas to cause portions of said substrate to separate from said backplane and to form a gap between portions of said substrate and said backplane such that a seal is not formed between said substrate and said backplane;

a first suspension system having a first spring element for holding said substrate against the movable backplane in the process position, said first spring element position for engaging a periphery of the substrate and operable to provide a first spring deflection to clamp the substrate against the backplane;

a second suspension system coupled between a fixed element and the first suspension system, said second suspension system including a second spring element operable to provide a second spring deflection directed against the first suspension system to further clamp the substrate against the backplane, said first and second spring deflections collectively creating a total spring deflection for the first and second suspension systems to generate a clamping force for holding the substrate against the backplane and minimizing the size of said gap;

the deflection of the second spring element providing approximately 80% to 90% of the total spring deflection to reduce stress on the first spring element which engages the substrate.

2. The device according to claim 1, wherein said first suspension system includes a diaphragm for forming a plurality of first spring elements.

3. The device according to claim 1, wherein said first suspension system includes a plurality o first spring elements, the substrate including an outer peripheral area wherein said first spring elements contact a substantially continuous portion of said outer peripheral area such that said clamping force is distributed uniformly around said outer peripheral area.

4. The device according to claim 1, wherein said clamping force is between approximately 5 to 20 pounds.

5. The device according to claim 1, wherein said first and second spring deflections total approximately 0.1 inches.

6. The device according to claim 1, wherein said gap size is 0.002 inches or less.

7. The clamping device according to claim 1, wherein said backplane has a convex shaped surface.

8. The clamping device according to claim 1, further comprising a shield affixed above said first suspension system to protect said first suspension system from excess deposition.

9. A clamping device for providing a clamping force to secure a substrate for processing, the clamping device comprising:

a movable backplane configured to move to a process position, the backplane including a passageway for introducing a gas to be discharged from said backplane, wherein said passageway is operable to direct the gas to cause portions of said substrate to separate from said backplane and to form a gap between portions of said substrate and said backplane such that a seal is not formed between said substrate and said backplane;

a first suspension system having a first spring element for holding said substrate against the movable backplane in the process position, said first spring element positioned for engaging a periphery of the substrate and operable to provide a first spring deflection to clamp the substrate against the backplane;

a second suspension system coupled with the first suspension system, said second suspension system including a generally floating fixture element having a weight for providing a force on said first suspension system to direct the first spring elements against the substrate to generate a clamping force for holding the substrate against the backplane and minimizing the size of said gap.

* * * * *